United States Patent
Heller et al.

(10) Patent No.: US 8,512,809 B2
(45) Date of Patent: Aug. 20, 2013

(54) METHOD OF PROCESSING MULTILAYER FILM

(75) Inventors: Christian Maria Anton Heller, Albany, NY (US); Anil Raj Duggal, Niskayuna, NY (US); Dennis Joseph Coyle, Clifton Park, NY (US); Min Yan, Ballston Lake, NY (US); Ahmet Gün Erlat, Clifton Park, NY (US); Ri-an Zhao, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 178 days.

(21) Appl. No.: 12/751,734

(22) Filed: Mar. 31, 2010

(65) Prior Publication Data

US 2011/0244141 A1   Oct. 6, 2011

(51) Int. Cl.
  *B05D 3/10*   (2006.01)
(52) U.S. Cl.
  USPC .......................................... 427/333; 427/331
(58) Field of Classification Search
  None
  See application file for complete search history.

(56) References Cited

U.S. PATENT DOCUMENTS

| | | | | |
|---|---|---|---|---|
| 4,000,049 | A * | 12/1976 | Boy et al. | 204/157.78 |
| 4,374,163 | A * | 2/1983 | Isenberg | 427/253 |
| 4,609,562 | A * | 9/1986 | Isenberg et al. | 427/8 |
| 5,013,584 | A * | 5/1991 | Wreede et al. | 427/162 |
| 5,672,388 | A * | 9/1997 | McHenry et al. | 427/255.26 |
| 6,248,682 | B1 * | 6/2001 | Thompson et al. | 502/4 |
| 6,743,473 | B1 | 6/2004 | Parkhe et al. | |
| 7,663,312 | B2 | 2/2010 | Anandan | |
| 2002/0182343 | A1 * | 12/2002 | Yuda et al. | 427/569 |
| 2005/0070424 | A1 * | 3/2005 | Chiang et al. | 502/64 |
| 2005/0226809 | A1 * | 10/2005 | Gudlavalleti et al. | 423/651 |
| 2006/0046115 | A1 * | 3/2006 | Bitoh | 429/22 |
| 2008/0241383 | A1 * | 10/2008 | Yoshino | 427/255.28 |

FOREIGN PATENT DOCUMENTS

| | | |
|---|---|---|
| WO | 2004105149 A1 | 12/2004 |
| WO | 2006014591 A2 | 2/2006 |
| WO | 2007140377 A3 | 12/2007 |

OTHER PUBLICATIONS

Zeolite definition, Wikipedia, downloaded Aug. 2012.*
"The Science—plugging gaps in current technologies"; Science Daily (Apr. 30, 2008), Agency for Science, Technology and Research (A*Star), Singapore, 4 Pages.
Search Report and Written Opinion from corresponding PCT Application No. PCT/US2011/025792 mailed on Jul. 1, 2011.

* cited by examiner

*Primary Examiner* — Joseph Miller, Jr.
(74) *Attorney, Agent, or Firm* — Mary Louise Stanford

(57) ABSTRACT

A method of processing a multilayer film is provided. The method includes providing a substrate film having a substrate film first surface and a substrate film second surface. The method also includes providing a barrier layer adjacent to the substrate film second surface. The barrier layer has at least one opening allowing fluid communication between the substrate film and an outer surface of the barrier layer. Further, the method includes contacting the substrate film first surface with a first reactant and finally contacting the outer surface of the barrier layer with a second reactant, said second reactant being reactive with said first reactant. The method of contacting the substrate film first surface to the first reactant and contacting the outer surface of the barrier layer to the second reactant is carried out under conditions under which reaction between said first reactant and the second reactant results in a formation of a reaction layer.

16 Claims, 2 Drawing Sheets

METHOD OF PROCESSING MULTILAYER FILM

BACKGROUND

The invention relates generally to a method of processing a multilayer film and more particularly to a method of processing a multilayer film with a barrier layer and forming a reaction layer for plugging openings in the barrier layer.

Generally, a multilayer film having a barrier layer is used in variety of applications. Non-limiting examples of a device using a multilayer film with a barrier layer are food packages and bottles having barrier foils used to keep food fresh by keeping gases such as oxygen, humidity, or carbon dioxide in or out. Other example of a device using multilayer film is an electroluminescent (EL) device known in the graphic display and imaging art. Such multilayer film barriers are the object of increasing interest in the packaging, pharmaceutical, optical and electronic industries, and have to be employed when the need for flexibility, optical transparency, weight or cost rules out the use of truly impermeable substrates such as metal foils or glass sheets. The multilayer film usually includes a substrate layer along with the barrier layer for impeding the permeation of moisture, oxygen, carbon dioxide and other permeants. However, the presence of defects such as pores, pinholes, cracks or other imperfections in the barrier layer limits the performance of the multilayer films, thereby, making the multilayer films pervious to environmental factors such as oxygen, water vapor, carbon dioxide, hydrogen sulfide, $SO_x$, $NO_x$, solvents, and the like. The environmental factors, typically oxygen and water vapor permeation, may cause degradation over time and thus may decrease the lifetime of the electroluminescent devices in flexible applications. Advanced barrier films which can limit permeation to acceptably low levels exist but typically require multiple fabrication steps and hence are time consuming and uneconomical. Moreover, even these advanced barriers are still limited by pinholes and only barely meet the requirements in terms of average permeation and observed pinhole density.

Therefore, there is a need to improve the performance of the multilayer film and to develop a method of doing the same, in a manner requiring a minimal number of processing steps.

BRIEF DESCRIPTION

In accordance with an embodiment of the invention, a method of processing a multilayer film is provided. The method includes providing a substrate film having a substrate film first surface and a substrate film second surface. The method also includes providing a barrier layer adjacent to the substrate film second surface. The barrier layer has at least one opening allowing fluid communication between the substrate film and an outer surface of the barrier layer. Further, the method includes exposing the substrate film first surface with a first reactant and finally exposing the outer surface of the barrier layer with a second reactant, said second reactant being reactive with said first reactant. The method of exposing the substrate film first surface to the first reactant and exposing the outer surface of the barrier layer to the second reactant is carried out under conditions under which reaction between said first reactant and the second reactant results in a formation of a reaction layer.

In accordance with another embodiment of the invention, a method for forming a reaction layer on a substrate film is provided. The method includes providing a substrate film having a first outer surface and a second outer surface. The method also includes exposing the first outer surface with a first reactant. Further, the method includes exposing the second outer surface of the substrate film with a second reactant, said second reactant being reactive with said first reactant to form the reaction layer. It is to be noted that the substrate film is permeable to the first reactant allowing reaction between the first reactant and the second reactant on the second outer surface of the substrate film.

In accordance with yet another embodiment of the invention, a method for forming a reaction layer on a substrate film is provided. The method includes providing a substrate film having a first outer surface and a second outer surface. Further, the method includes saturating the substrate film with a first reactant. Finally the method includes exposing the first outer surface or the second outer surface of the saturated substrate film with a second reactant said second reactant being reactive with said first reactant to form the reaction layer.

DRAWINGS

DETAILED DESCRIPTION

As discussed in detail below, embodiments of the invention are directed towards a method of processing a multilayer film with a barrier layer and forming a reaction layer for plugging openings or voids in the barrier layer. As used herein, the terms 'openings or voids' refers to pores, pinholes, cracks, and the like. The present invention thus, addresses a method of processing a multilayer film with a barrier layer or a metal layer having such openings or voids.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Any examples of operating parameters are not exclusive of other parameters of the disclosed embodiments.

Figure 1:
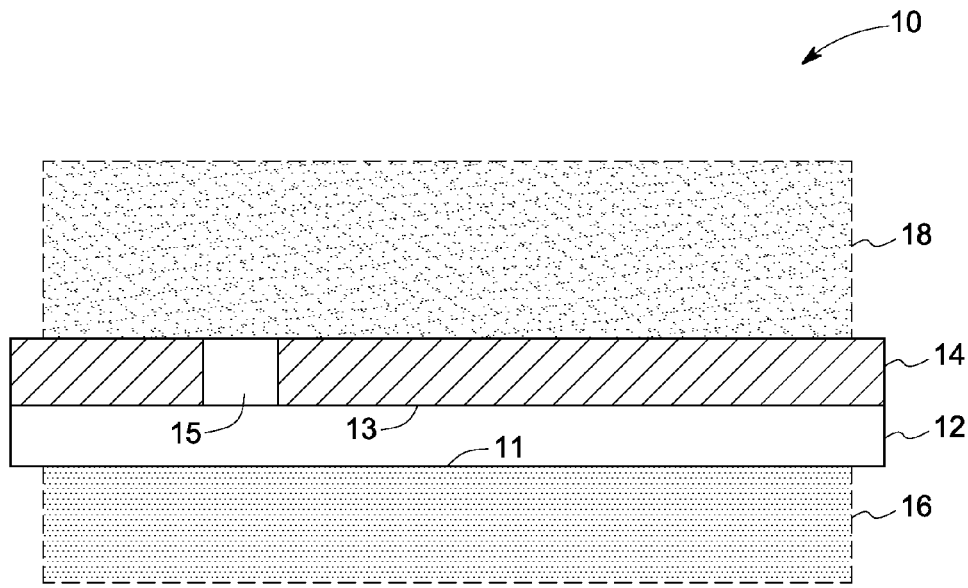
FIG. 1 shows a multilayer film including a barrier layer and a substrate layer in accordance with an embodiment of the present invention.

FIG. 1 illustrates a multilayer film 10 in accordance with an embodiment of the present invention. As shown, the multilayer film 10 includes a substrate film layer 12 having a substrate film first surface 11 and a substrate film second surface 13. In some embodiments the substrate material may be flexible and/or substantially transparent. In one embodiment, the substrate film layer 12 may be a single piece or a structure including a plurality of adjacent pieces of different materials. A non-limiting example of the substrate film layer 12 material may include a thermoplastic. Other non-limiting examples of the substrate materials include organic polymeric resins such as, but not limited to, a polyethylene terephthalate (PET), a polyacrylate, a polynorbornene, a polycarbonate (PC), a silicone, an epoxy resin, a silicone-functionalized epoxy resin, a polyester such as MYLAR®

(available from E. I. du Pont de Nemours & Co.), a polyimide such as KAPTON® H or KAPTON® E (available from du Pont), APICAL® AV (available from Kaneka High-Tech Materials), UPILEX® (available from Ube Industries, Ltd.), a polyethersulfone, a polyetherimide such as ULTEM® (available from General Electric Company), a poly(cyclic olefin), or a polyethylene naphthalate (PEN). Additional substrate materials may include an ultra-thin layer of glass or a metal foil or a fused ceramic having pores, pinholes or cracks. Furthermore, substrate material under various industrial names may include Aclar, Vectran, Tefzel, Surlyn, PET ST504, PET mylar D, Armstrong A661, Tedlar, BRP-C, PVC Black, PO 100, PO 130, Kapton, PVC clear, Korad, EVA, PVB, TPU, DC Sylguard, GE RTV 615. It is to be noted that combinations of substrate materials are also within the scope of the invention.

The multilayer film 10 also includes a barrier layer 14 adjacent to the substrate film layer second surface 13. In one embodiment, the multilayer film 10 may have a substrate film layer placed between two barrier layers on either side of the substrate film. The barrier layer 14 may be a metallic or ceramic thin film coating produced by dip-coating, spray-coating, physical vapor deposition, chemical vapor deposition (CVD), plasma-enhanced chemical vapor deposition (PECVD), sputtering, and or reactive sputtering, or other means. Various embodiments of the multilayer film 10 may include a single layer barrier, or a multi-layer barrier, or a multi-zone graded barrier. As illustrated, the barrier layer 14 includes an opening or void 15. In another embodiment, the barrier layer 14 may include multiple openings or voids 15. Such openings or voids 15 are defects of the barrier layer 14 and may include pores, pinholes, cracks, or the like.

Furthermore, in one embodiment as illustrated in FIG. 1, the multilayer film 10 incorporates a technique of a formation of a reaction layer at the opening or void 15. The multilayer film 10 having the substrate film layer 12 and the barrier layer 14, is exposed to a first reactant 16 on the substrate film first surface 11. The multilayer film 10 is also exposed to a second reactant 18 on the outer surface of the barrier layer 14. The first reactant 16 and the second reactant 18 may include a liquid reactant or a volatile reactant or a mixture of reactants. The first reactant 16 and substrate film material are chosen such that the reactant is substantially permeable in the substrate. This allows the first reactant 16 to permeate through the substrate film layer 12 and reach the barrier layer 14 openings or voids 15 for subsequent reaction with the second reactant 18 at an appropriate temperature condition. The reaction results in the formation of the reaction layer in the opening or void 15, thereby, enables plugging of the opening or void 15 for the targeted permeants such as oxygen, humidity, carbon dioxide and the like. Further, the reaction can also be enhanced by the addition of energy from an energy source chosen from a group of an ultra-violet energy source, a plasma source or an ultrasound. The formation of the reaction layer also increasingly separates the reactants or precursors from each other and further makes the reaction process as self-limiting.

In one embodiment, the substrate film layer 12 can be processed or treated with the first reactant in a roll or sheet form. In another embodiment, the substrate film layer 12 can be processed or treated after being shaped into, for example, a bottle. The latter is important, as subsequent shaping/drawing processes typically will damage any thin film barrier such as a non-metallic barrier film, as the non-metallic thin barrier film tend to be very brittle. Further, in one embodiment, the thickness of the substrate film layer 12 may be about 5 micrometer to about 250 micrometer. Since the first reactant has to permeate through the substrate film layer 12, thinner and more permeable substrates film layer might be preferred, for enhancing reaction rates at an optimum temperature for the formation of the reaction layer. Moreover, it is to be noted that a reaction rate for the formation of the reaction layer or a film deposition rate depends on permeant capacity of a substrate film layer for a particular said first reactant.

By way of an example in a non-limiting manner, one embodiment of the invention may have a reaction layer formation rate of about 80 nanometer per minute (nm/min). Such an embodiment includes 100 micrometer thick PET (substrate film layer) with water as the first reactant with a permeability of about 11 grams millimeter per square meter per day (g-mm/m$^2$/day) at 85 degree Celsius. Using the water density of 1 gram per cubic centimeter (g/cm$^3$), the reaction rate for the formation of reaction layer is thereby determined to be about 80 nanometer per minute (nm/min) with a permeant lag time determined to be about 3 minutes. It is to be noted that the permeation of water (first reactant) varies significantly with respect to temperature and material. Further, it may be noted that the reaction rate may also depend on the second reactant. More particularly, the steady state permeation rate of water at 25 degree Celsius through a PET substrate such as PET ST504 is about 0.243 grams millimeter per square meter per day (g-mm/m$^2$/day), whereas the permeation rate through the PET ST504 at 85 degree Celsius is about 11.2 grams millimeter per square meter per day (g-mm/m$^2$/day). Thus, the formation of the reaction layer or deposition film is carried out effectively by increasing the permeation rate of the reactants or precursors through the substrate film layer and to the edges of the barrier layer at an optimum temperature, such as above the glass transition temperature of the substrate material.

In a further embodiment, a non-limiting example of exposing the first reactant 16 on the substrate film layer 12 may include confining a volume at the substrate film first surface 11 and filling the volume with a first reactant 16, which first reactant 16 may be a liquid precursor that has a higher mobility on the substrate film first surface 11. Further, a volume is confined on the outer surface of the barrier layer 14 such that the volume overlaps and corresponds to the volume at the substrate film first surface 11. The confined volume at the outer surface of the barrier layer 14 is then filled with second reactant 18 as shown in FIG. 1. This results in the formation of the reaction layer when the first reactant permeates through the substrate film layer 12 and reacts with the second reactant at the opening or void 15. The confining of the corresponding volumes on either side of the multilayer film 10 for subsequent exposing with the reactants is required to ensure effective formation of the reaction layer at the openings or voids of the barrier layer 14. This further avoids unnecessary reaction occurring due to flowing of the reactants around the edges of the multilayer film 10.

Additionally, in another embodiment, the substrate film layer 12 may be pre-saturated with the first reactant 16. The pre-saturation of the substrate film layer 12 is carried out to ensure the first reactant 16 and second reactant 18 do not react directly but allow the first reactant 16 contained in pre-saturated substrate film layer to reach the opening or void of the barrier layer 14 from one side and react with the second reactant 18 applied to the barrier layer 14 from the other side. This results in plugging of the openings or voids 15 efficiently. In a non-limiting example, a substrate material of PET can be suitably saturated with water as the first reactant. This pre-saturation can be carried out in a simple chamber, thus avoiding any formation of ineffective reaction layer from flowing of the reactants around the edges of the multilayer film 10.

Figure 2:
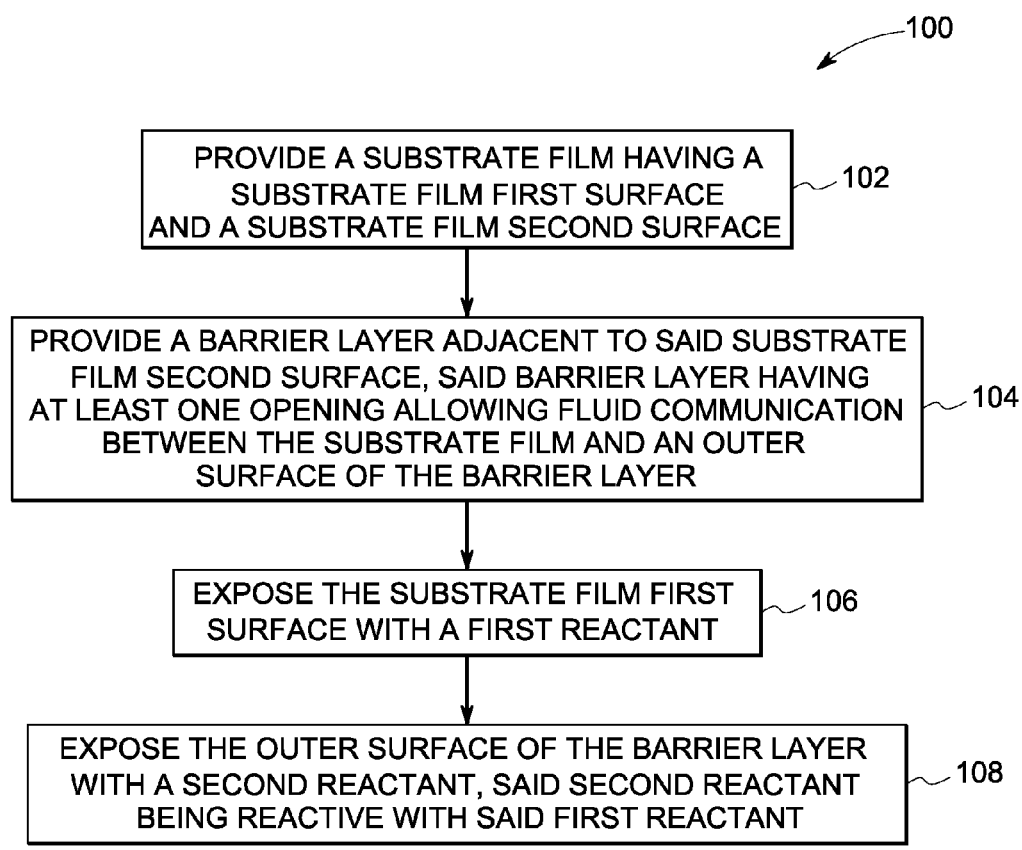
FIG. 2 shows a flowchart for processing a multilayer film in accordance with one embodiment of the present invention.

FIG. 2 illustrates a flowchart 100 for processing a multilayer film in accordance with an embodiment of the present invention. The following steps of processing of the multilayer film results in improved resistance to diffusion of chemical species or environmental factors such as oxygen, water vapor, carbon dioxide, hydrogen sulfide, $SO_x$, $NO_x$, solvents, and the like. This may result in extended freshness of packaged food, or extended shelf-life of ambient-sensitive devices that incorporates the multilayer film of the present invention. Firstly, at step 102, the method includes providing a substrate film having a substrate film first surface and a substrate film second surface. At step 104, the method includes providing a barrier layer adjacent to the substrate film second surface. Generally, the barrier layer has one or more opening or voids such as pores, pinholes, cracks and the like. The present method of processing of the multilayer film enables plugging of such openings or voids. In one embodiment, the barrier layer is a metal layer disposed on the substrate layer. In another embodiment, the barrier layer may include a barrier coating in contact with the substrate film.

Non-limiting examples of the barrier layer material includes gold, silver and aluminum. The metal layer is typically a zero-valent metal. The barrier layer may also include nitrides such as silicon nitride in one non-limiting example. Other non-limiting barrier layer compositions include those selected from organic materials, inorganic materials, ceramic materials, and any combination thereof. In one example, the materials are recombination products derived from reacting plasma species and are deposited on the substrate film surface. Organic barrier coating materials may typically include carbon and hydrogen, and optionally other elements, such as oxygen, nitrogen, silicon, sulfur and like elements. Suitable reactants that result in organic compositions in the barrier coating comprise straight or branched alkanes, alkenes, alkynes, alcohols, aldehydes, ethers, alkylene oxides, aromatics, or like species, having up to about 15 carbon atoms. Inorganic and ceramic barrier coating materials typically include oxides, nitrides, borides, or any combinations thereof, of elements of Groups IIA, IIIA, IVA, VA, VIA, VIIA, IB or IIB; metals of Groups IIIB, IVB, or VB, or rare earth elements. For example, a barrier coating including silicon carbide can be deposited on a substrate by recombination of plasmas generated from silane and an organic material, such as methane or xylene. A barrier coating including silicon oxycarbide can be deposited from plasmas generated from silane, methane, and oxygen, or silane and propylene oxide, or from plasma generated from organosilicone precursors, such as tetraethoxy orthosilane (TEOS), hexamethyl disiloxane (HMDS), hexamethyl disilazane (HMDZ), or octamethyl cyclotetrasiloxane (D4). A barrier coating including silicon nitride can be deposited from plasmas generated from silane and ammonia. A barrier coating including aluminum oxycarbonitride can be deposited from a plasma generated for example from a mixture of aluminum tartrate and ammonia. In some embodiments barrier coatings comprising organic materials may be deposited using known methods such as, but not limited to, spin coating, flow coating, gravure or microgravure process, dip coating, spray coating, vacuum deposition, chemical vapor deposition (CVD), plasma enhanced chemical vapor deposition (PECVD), or like methods such as radio frequency plasma enhanced chemical vapor deposition (RF-PECVD), expanding thermal-plasma chemical vapor deposition, reactive sputtering, electron-cyclotron-resonance plasma enhanced chemical vapor deposition (ECRPECVD), inductively coupled plasma enhanced chemical vapor deposition (ICPECVD), sputter deposition, evaporation, atomic layer deposition, or combinations thereof.

Further, at step 106, the method includes exposing the substrate film first surface with a first reactant. Finally the method of processing the multilayer film includes exposing the outer surface of the barrier layer with a second reactant at step 108. The second reactant is reactive with said first reactant and forms a reaction layer at the opening or void of the barrier layer. This reaction layer effectively plugs the openings of the barrier layer ensuring prevention of permeation of chemical species or environmental factors. Both the method steps of exposing the substrate film first surface to the first reactant and exposing the outer surface of the barrier layer to the second reactant are carried out synchronously or asynchronously under conditions resulting in the formation of the reaction layer. The processing conditions may include an appropriate temperature and duration for the formation of the reaction layer at the openings or voids of the barrier layer. The reaction between the reactants can be enhanced further by addition of energy source such as a plasma source, an ultraviolet source, an ultrasonic source, corona discharge or e-beam.

In one example as shown in FIG. 1, the barrier layer and the substrate film layer are exposed sequentially to one or more reactants, which reactants may include deposition species or precursors (referred as reactant layers 16, 18 in FIG. 1). In one embodiment, the deposition species or precursors are all in the gas phase. In another embodiment, one or both precursors are applied in liquid form, or inside a viscous paste. In yet another embodiment, the multilayer film having the barrier layer disposed on the substrate film is fed into the process chamber using a continuous or semi-continuous roll-to-roll process. In one embodiment of the roll-to-roll process the process chamber is configured to enable the continuous movement of the multilayer film. Alternatively, the process may be conducted using a batch process whereby the barrier layer disposed on at least one surface of the substrate is placed over a holder within the process. An optional plasma source may be positioned within the process chamber. Use of the plasma source or other surface activation techniques such as, for example, use of electron beam, ultraviolet, ozone, or corona, may increase the reaction rate and may improve the quality of the deposition and formation of reaction layer. Optionally, alternating current (AC) or direct current (DC) sputtering may be performed in conjunction with this process.

The selection of reactants may have a bearing on the adherence of the reactants to the barrier layer and the substrate film layer of the multilayer film. In one embodiment at least one of the deposition species or precursors (reactants) is one that may wet the barrier layer. In another embodiment, an organometallic compound is added prior to the deposition of the reactants on an organic substrate film layer. This facilitates the adhesion of the first reactant to the surface of the organic substrate film first surface layer at the step 106 as discussed above. The adhesion of the deposition species or precursors to the substrate film layer and to the edges of the barrier layer may be further achieved by processing the multilayer film at an optimum temperature, such as above the glass transition temperature of the substrate material. In another embodiment, the method for facilitating adhesion of the reactants to the layers of the multilayer film may include using ultrasound to move loose particles and seal weak spots and cracks in the multilayer film. Moreover, if the barrier layer contains functional groups, the second reactants may be chosen such that it may be reactive to the functional groups thereby forming a monolayer that is chemically bonded to the barrier layer, and may be capable of engaging in optional further reactions to form the reaction layer. When the barrier layer has no functional groups, an initial deposition may be conducted to functionalize the surface of the barrier layer.

The resultant reaction layer at the openings or voids of the barrier layer may include a metal such as, but not limited to, zinc, cadmium, silicon, aluminum, germanium, copper, tungsten, titanium, or tantalum, or a metal-based compound such as, but not limited to, a metal halide, a metal oxide, a metal sulfide, a metal nitride, a metal carbide, or a bimetallic or trimetallic compound may be obtained by reaction on the surface of the barrier layer using deposition species or precursors. Non-limiting examples of deposition species or precursors include a metal or a metal precursor such as, a metal halide, a metal alkyl compound, a metal alkoxide, an orthosilicate, a metal beta-diketonato compound, a metal cyclopentadienyl compound, a metal carboxylate, a metal carbonyl, a metal hydride, a metal alkylamide or silylamide, or a bimetallic compound, or combinations thereof. Illustrative metal halides include, but are not limited to, halides of aluminum, gallium, indium, silicon, germanium, titanium, zirconium, hafnium, tantalum, molybdenum, tungsten, manganese, copper, zinc or cadmium. In one embodiment of an atomic layer deposition process, the first deposition species or precursors on the substrate film layer may include a non-metal and/or other precursor and the second deposition species on the barrier layer may include a metal or a metal precursor described above, that may react with the first deposition species or precursors of non-metal deposited over the substrate film layer. Illustrative non-metal and other precursors include sulfur, selenium, tellurium, water, oxygen, alcohol, ammonia, or a hydride or a sulfide of a non-metal. For example, in one embodiment, a reaction layer including alumina may be deposited on the openings of the barrier layer using a second deposition species or precursor including trimethyl aluminum (TMA) on the barrier layer, followed by a first deposition species or precursor including water, alcohol, or silanol, or combination thereof on the substrate film layer. In another embodiment, the substrate film layer may be first exposed to gaseous TMA followed by purging with an inert gas, and subsequently exposed to vapors of water or alcohol to complete the cycle. In another illustrative example the reaction layer including silica nanolaminates may be formed by exposing the barrier layer to alternating deposition species such as catalytic compounds and then an alkoxysilanol, alkoxyalkylsilanol, or alkoxysilanediol compound. Suitable catalytic compounds comprise metal carboxylates or metal alcoholates such as, but not limited to, dibutyl tin dilaurate, dibutyl tin diacetate, titanium isopropoxide, zinc octoate, mixtures thereof, and the like.

Figure 3:
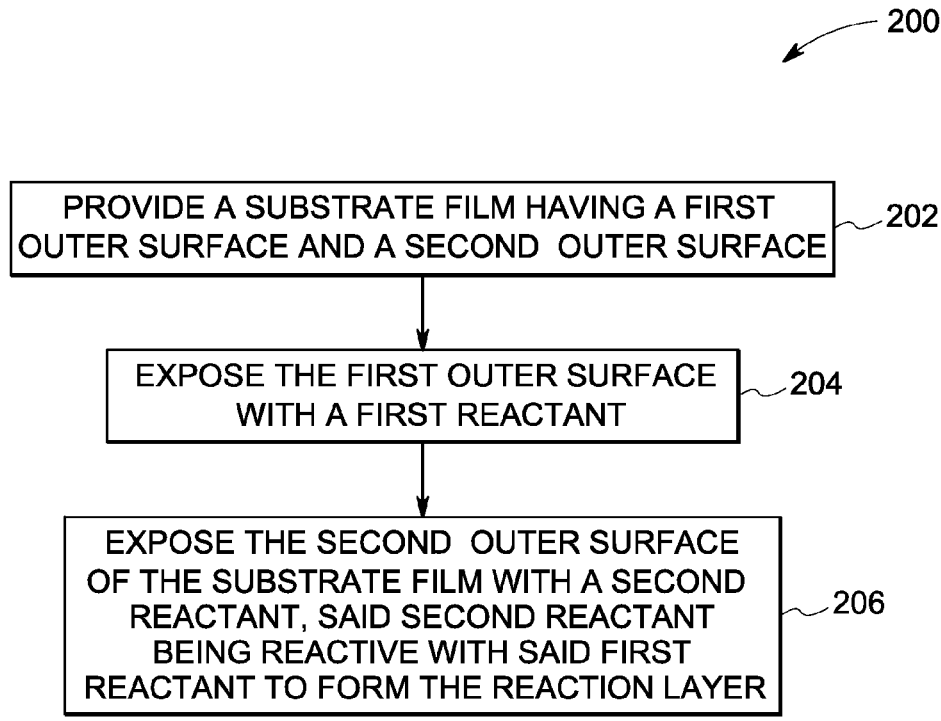
FIG. 3 shows a flowchart of a method for forming a reaction layer on a substrate film in accordance with yet another embodiment of the present invention.

FIG. 3 illustrates a flowchart 200 for a method of forming a reaction layer on a substrate film in accordance with another embodiment of the present invention. It is to be noted that the substrate film is similar in terms of feature and material characteristics to the substrate film layer 12 (as shown in FIG. 1), but does not have a barrier film at the start of the process. In step 202, the method includes providing a substrate film having a first outer surface and a second outer surface. At step 204, the method includes exposing the first outer surface with a first reactant. Further, the method includes exposing the second outer surface of the substrate film with a second reactant at step 206, said second reactant being reactive with said first reactant to form the reaction layer. It may be noted that the reactants are similar to the deposition species or precursors as already discussed in the method embodied in FIG. 2 above. Further, in one embodiment the substrate film is permeable to the first reactant allowing reaction between the first reactant and the second reactant on the second outer surface of the substrate film layer. In another embodiment, the substrate film is permeable to the second reactant, which second reactant permeates through the substrate film to react with the first reactant and form a reaction layer at the first outer surface of the substrate film.

Figure 4:
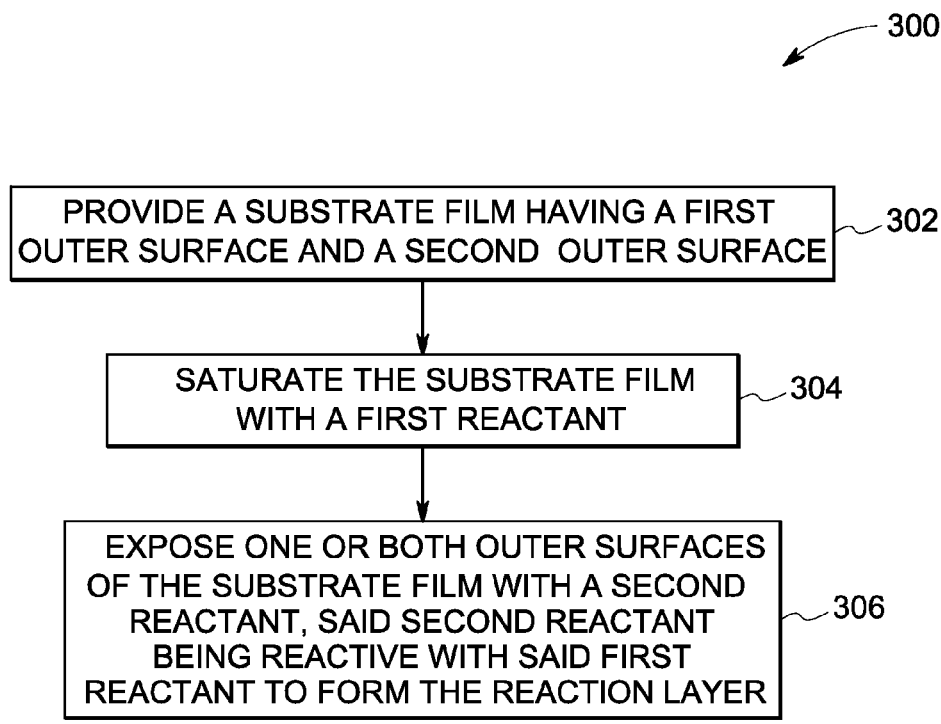
FIG. 4 shows a flowchart of a method for forming a reaction layer on a pre-saturated substrate film in accordance with yet another embodiment of the present invention.

FIG. 4 illustrates a flowchart 300 for a method of forming a reaction layer on a substrate film in accordance with another embodiment of the present invention. It is to be noted that the substrate film is similar in terms of feature and material characteristics to the substrate film layer 12 (as shown in FIG. 1). In step 302, the method includes providing a substrate film having a first outer surface and a second outer surface. At step 304, the method includes saturating the substrate film with a first reactant. Further, the method includes exposing either the first outer surface or the second outer surface of the substrate film with a second reactant at step 306. The second reactant reacts with the first reactant to form the reaction layer. In another embodiment, the method may include exposing both the outer surfaces of the saturated substrate film with the second reactant, resulting in the formation of the reaction layer on both the outer surfaces of the substrate film. It may be noted that the reactants are similar to the deposition species or precursors as already discussed in the method embodied in FIG. 2 above.

Advantageously, the multilayer film, according to embodiments of the invention, finds use in packaging industries for preparing sealed food packages, beverage bottles and in many pharmaceutical, optical and electronic industries, wherein the need for flexibility, optical transparency, weight or cost rules out the use of truly impermeable substrates such as metal foils or glass sheets. Other applications of the multiplayer film includes devices or components such as, but not limited to, electroactive devices that are susceptible to reactive chemical species normally encountered in the environment. Non-limiting examples of electroactive devices include an electroluminescent device, a flexible display device including a liquid crystalline display (LCD), a thin film transistor LCD, a light emitting diode (LED), a light emitting device, an organic light emitting device (OLED), an optoelectronic device, a photovoltaic device, an organic photovoltaic device, an integrated circuit, a photoconductor, a photodetector, a chemical sensor, a biochemical sensor, a component of a medical diagnostic system, an electrochromic device, or any combination thereof. In another example the multilayer film as described in embodiments of the invention can advantageously be used in packaging of materials, such as food stuff, that are easily spoiled by chemical or biological agents normally existing in the environment.

Furthermore, the skilled artisan will recognize the interchangeability of various features from different embodiments. Similarly, the various method steps and features described, as well as other known equivalents for each such methods and feature, can be mixed and matched by one of ordinary skill in this art to construct additional systems and techniques in accordance with principles of this disclosure. Of course, it is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of processing a multilayer film, said method comprising:
   providing a substrate film having a substrate film first surface and a substrate film second surface, wherein the substrate film is transparent and flexible;
   depositing or coating a barrier layer on said substrate film second surface, said barrier layer having at least one opening allowing fluid communication between the substrate film and an outer surface of the barrier layer;
   exposing the substrate film first surface with a first reactant; and
   exposing said outer surface of the barrier layer with a second reactant, said second reactant being reactive with said first reactant;
      wherein said exposing the substrate film first surface to the first reactant and said exposing said outer surface of the barrier layer to the second reactant is carried at above a glass transition temperature of the substrate film and under conditions under which a reaction between said first reactant and said second reactant results in a formation of a reaction layer.

2. The method according to claim 1, wherein the formation of the reaction layer plugs said opening in the barrier layer.

3. The method according to claim 1, wherein the at least one opening in the barrier layer is a pinhole imperfection or a crack.

4. The method according to claim 1, wherein said substrate film comprises a thermoplastic.

5. The method according to claim 1, wherein said barrier layer comprises a zero-valent metal and said zero-valent metal is selected from the group consisting of gold, silver, and aluminum.

6. The method according to claim 1, wherein a barrier layer material is selected from a group comprising a metal, nitrides, organic materials, inorganic materials and ceramic materials.

7. The method according to claim 1, wherein said exposing the substrate film first surface with a first reactant, and said exposing said outer surface of the barrier layer with a second reactant, is carried out synchronously.

8. The method according to claim 1, wherein said first reactant is selected from a group comprising water, sulfur, selenium, tellurium, oxygen, alcohol, ammonia, or a hydride or a sulfide of a non-metal.

9. The method according to claim 1, wherein said second reactant is an orthosilicate.

10. The method according to claim 1, wherein said second reactant is selected from a group comprising a metal halide, a metal alkyl compound, a metal alkoxide, an orthosilicate, a metal beta-diketonato compound, a metal cyclopentadienyl compound, a metal carboxylate, a metal carbonyl, a metal hydride, a metal alkylamide or silylamide, or a bimetallic compound, or combinations thereof.

11. The method according to claim 1, wherein the substrate film is an organic film.

12. The method according to claim 1, wherein the method comprises adding an organometallic compound for adhesion of said first reactant to the substrate film and the barrier layer.

13. The method according to claim 1, wherein the method comprises providing an additional energy for reaction from a source selected from a group consisting of an ultra-sound system, a plasma source and an ultra-violet radiation source.

14. A method of forming a reaction layer on a polymeric substrate film, said method comprising:
   providing the polymeric substrate film having a first outer surface and a second outer surface, wherein the polymeric substrate film is transparent and flexible;
   exposing the first outer surface with a first reactant; and
   exposing the second outer surface of the polymeric substrate film with a second reactant, said second reactant being reactive with said first reactant to form the reaction layer;
      wherein said polymeric substrate film is permeable to the first reactant allowing a reaction between said first reactant and said second reactant on the second outer surface of the polymeric substrate film, wherein the reaction is carried at above a glass transition temperature of the polymeric substrate film.

15. The method according to claim 14, wherein the polymeric substrate film comprises a thermoplastic.

16. The method according to claim 14, wherein the method further comprises providing a plurality of barrier layers adjacent to the polymeric substrate film.

* * * * *